(12) United States Patent
Sun et al.

(10) Patent No.: US 11,450,511 B2
(45) Date of Patent: Sep. 20, 2022

(54) METHODS AND APPARATUS FOR ZONE CONTROL OF RF BIAS FOR STRESS UNIFORMITY

(71) Applicant: Applied Materials, Inc., Santa Clara, CA (US)

(72) Inventors: Lizhong Sun, San Jose, CA (US); Yi Yang, Xi'an (CN); Jian Janson Chen, Fremont, CA (US); Chong Ma, Xi'an (CN); Xiaodong Yang, Xi'an (CN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/137,121

(22) Filed: Dec. 29, 2020

(65) Prior Publication Data

US 2022/0157563 A1 May 19, 2022

(30) Foreign Application Priority Data

Nov. 16, 2020 (WO) ................ PCT/CN2020/129029

(51) Int. Cl.
*H01J 37/32* (2006.01)
*H01J 37/34* (2006.01)

(52) U.S. Cl.
CPC .. *H01J 37/32183* (2013.01); *H01J 37/32568* (2013.01); *H01J 37/32715* (2013.01); *H01J 37/3405* (2013.01); *H01J 37/3455* (2013.01); H01J 2237/332 (2013.01)

(58) Field of Classification Search
None
See application file for complete search history.

(56) References Cited

U.S. PATENT DOCUMENTS

| | | | |
|---|---|---|---|
| 5,886,866 A | 3/1999 | Hausmann | |
| 5,914,568 A * | 6/1999 | Nonaka | H01L 21/6831 315/111.41 |
| 9,472,410 B2 | 10/2016 | Sadjadi et al. | |
| 10,032,608 B2 | 7/2018 | Chen et al. | |
| 2005/0220984 A1* | 10/2005 | Sun | H01J 37/32935 118/723 R |
| 2010/0213047 A1* | 8/2010 | Nagamine | C23C 14/50 204/192.12 |
| 2015/0311105 A1* | 10/2015 | Sadjadi | H01J 37/32715 438/798 |
| 2017/0040198 A1* | 2/2017 | Lin | H01J 37/32715 |
| 2018/0209035 A1* | 7/2018 | Liu | H01J 37/3405 |

\* cited by examiner

*Primary Examiner* — Jason Berman
(74) *Attorney, Agent, or Firm* — Moser Taboada

(57) ABSTRACT

Methods and apparatus are used for adjusting film stress profiles on substrates. An apparatus may include a PVD chamber with a pedestal configured to support a substrate during processing on a cover positioned on an uppermost surface of the pedestal. The cover is constructed with multiple electrodes such as, for example, a first electrode, a second electrode, and a third electrode. The second electrode is positioned between and electrically separated from the first electrode and the second electrode. A substrate stress profile tuner is electrically connected to the first electrode, the second electrode, and the third electrode and configured to independently adjust an RF voltage level of at least the second electrode and the third electrode relative to RF ground to produce a more uniform film stress profile.

18 Claims, 7 Drawing Sheets

METHODS AND APPARATUS FOR ZONE CONTROL OF RF BIAS FOR STRESS UNIFORMITY

CROSS-REFERENCE TO RELATED APPLICATIONS

This application claims the benefit of Patent Cooperation Treaty Application PCT/CN2020/129029, filed on 16 Nov. 2020, which is herein incorporated by reference in its entirety.

FIELD

Embodiments of the present principles generally relate to semiconductor manufacturing.

BACKGROUND

Stresses in deposited films on substrates may adversely affect the performances of devices that use the films. For example, in piezoelectric materials, stress levels and uniformity are very critical to the piezoelectric response and the yield of the fabricated devices. When a physical vapor deposition (PVD) chamber with magnetron sputtering deposition is used to form piezoelectric films, a universal RF bias may be used to modulate the stress level in a film. However, the inventors have found that the stress response to the universally applied RF bias power may cause nonuniform stress levels across a wafer's profile due to non-uniform magnetic fields and plasma distribution, resulting in a wide within wafer (WIW) stress range.

Accordingly, the inventors have provided methods and apparatus for generating more uniform stress levels within films deposited in a PVD chamber.

SUMMARY

Methods and apparatus for forming more uniform stress profiles in substrates are provided herein.

In some embodiments, an apparatus for adjusting film properties during deposition may comprise a physical vapor deposition (PVD) chamber with a processing volume, an upper electrode connected to a direct current (DC) power source positioned in the PVD chamber above the processing volume, the DC power source configured to generate plasma within the processing volume, a pedestal configured to support a substrate during processing in the PVD chamber and positioned below the processing volume, a cover applied to an uppermost surface of the pedestal, wherein the cover includes a plurality of electrodes; a substrate stress profile tuner electrically connected to each of the plurality of electrodes and configured to independently adjust an RF voltage level of at least one of the plurality of electrodes relative to RF ground, and an RF bias source electrically connected to the substrate stress profile tuner via a match network.

In some embodiments, the apparatus may further include wherein the DC power source is a pulsed DC power source, wherein the PVD chamber includes a magnetron assembly configured with at least one rotating permanent magnet positioned above the upper electrode, wherein the pedestal is formed of a ceramic material and contains electrical connections between the plurality of electrodes and the substrate stress profile tuner, wherein the plurality of electrodes includes a first electrode, a second electrode, and a third electrode, and wherein the second electrode is positioned between and electrically separated from the first electrode and the second electrode and the substrate stress profile tuner is configured to independently adjust the RF voltage level of at least the second electrode and the third electrode relative to RF ground, a first RF rod in the pedestal electrically connecting the first electrode to the substrate stress profile tuner, a second RF rod in the pedestal electrically connecting the second electrode to the substrate stress profile tuner, and a third RF rod in the pedestal electrically connecting the third electrode to the substrate stress profile tuner, wherein the substrate stress profile tuner is configured to independently adjust an RF bias voltage level of the first electrode, the second electrode, and the third electrode relative to RF ground, wherein the substrate stress profile tuner includes: a first tuning circuit positioned inside the substrate stress profile tuner and includes at least one first adjustable capacitor, wherein the first tuning circuit is electrically connected between the match network and the second electrode and a second tuning circuit positioned inside the substrate stress profile tuner which includes at least one second adjustable capacitor, wherein the second tuning circuit is electrically connected between the match network and the third electrode, a first voltage sensor electrically positioned between the first adjustable capacitor and the second electrode and a second voltage sensor electrically positioned between the second adjustable capacitor and the third electrode, wherein the substrate stress profile tuner further includes: a third tuning circuit positioned inside the substrate stress profile tuner which includes at least one third adjustable capacitor, wherein the third tuning circuit is electrically connected between the match network and the first electrode, a third voltage sensor electrically positioned between the third adjustable capacitor and the first electrode, wherein the first electrode has a disk shape, the second electrode has a first annular shape larger than the disk shape, and the third electrode has a third annular shape larger than the first annular shape, a stress detector that is configured to determine at least one stress profile of at least one substrate and a stress controller that is configured to receive the at least one stress profile of at least one substrate from the stress detector and independently adjust an RF bias voltage level for each of the plurality of electrodes via the substrate stress profile tuner, and/or wherein the stress detector is located in-situ in the PVD chamber or ex-situ from the PVD chamber.

In some embodiments, an apparatus for adjusting film properties during deposition may comprise a pedestal configured to support a substrate during processing in a PVD chamber and configured to be positioned below a processing volume of the PVD chamber, a first electrode with a disk shape that is positioned in a central area of the pedestal proximate an uppermost surface of the pedestal, wherein the first electrode is configured to accept a first RF bias voltage adjustment from a substrate stress profile tuner, a second electrode with a first annular shape that surrounds the first electrode proximate an uppermost surface of the pedestal and is electrically isolated from the first electrode, wherein the second electrode is configured to accept a second RF bias voltage adjustment from the substrate stress profile tuner, and a third electrode with a second annular shape that surrounds the second electrode proximate an uppermost surface of the pedestal and is electrically isolated from the second electrode, wherein the third electrode is configured to accept a third RF bias voltage adjustment from the substrate stress profile tuner.

In some embodiments, the apparatus may further include wherein the first electrode, the second electrode, and the third electrode are electrically separated by an air gap or an electrically insulating material, a first RF rod in the pedestal which is configured to electrically connect the first electrode to the substrate stress profile tuner, a second RF rod in the pedestal which is configured to electrically connect the second electrode to the substrate stress profile tuner, and a third RF rod in the pedestal which is configured to electrically connect the third electrode to the substrate stress profile tuner, the substrate stress profile tuner electrically connected to the first electrode, the second electrode, and the third electrode and configured to independently adjust an RF voltage level of at least the second electrode and the third electrode relative to RF ground, wherein the substrate stress profile tuner includes: a first tuning circuit positioned inside the substrate stress profile tuner which includes at least one first adjustable capacitor, wherein the first tuning circuit is configured to be electrically connected to the second electrode and a second tuning circuit positioned inside the substrate stress profile tuner which includes at least one second adjustable capacitor, wherein the second tuning circuit is configured to be electrically connected to the third electrode.

In some embodiments, a method of adjusting a stress profile of a substrate may comprise receiving at least one stress profile of at least one substrate processed in a physical vapor deposition (PVD) chamber and independently adjusting, based on the at least one stress profile of at least one substrate, at least one RF bias voltage level of at least one of a plurality of electrically isolated RF bias electrodes proximate to a surface of a pedestal of the PVD chamber such that a uniformity of a stress profile is increased for subsequently processed substrates in the PVD chamber.

In some embodiments, the method may further include independently adjusting the at least one RF bias voltage level by changing a capacitance value of a tunable capacitor that is positioned in series between the at least one of a plurality of electrically isolated RF bias electrodes and an RF bias power source or independently adjusting one or more of at least one RF bias voltage level of one or more of the plurality of electrically isolated RF bias electrodes relative to a non-adjustable one of the plurality of electrically isolated RF bias electrodes to normalize the stress profile.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
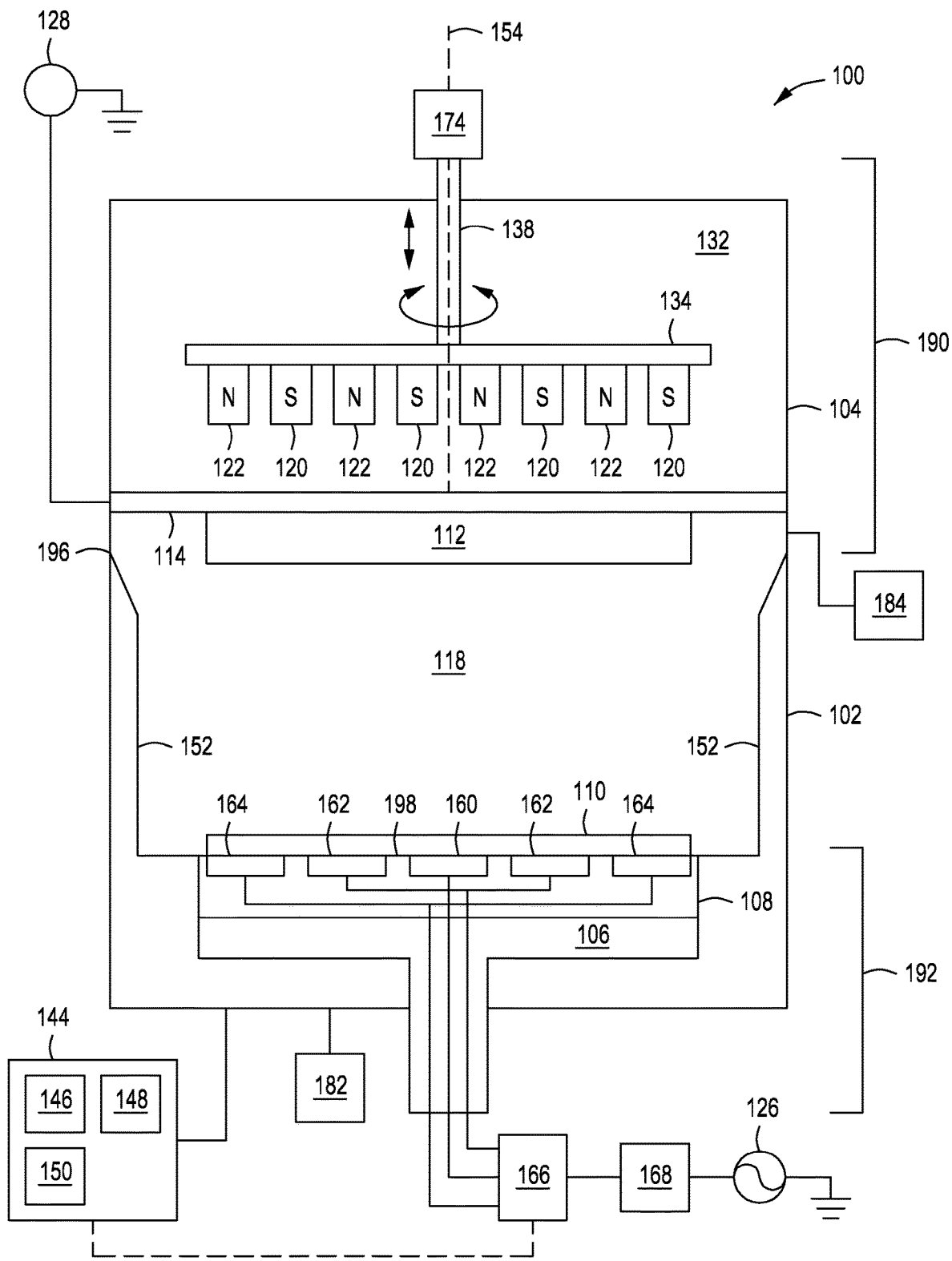
FIG. 1 depicts a cross-sectional view of a PVD chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus enable more uniform stress levels to be achieved in physical vapor deposition (PVD) deposited materials. The presence of uniform stress levels is especially critical for, but not limited to, producing piezoelectric materials by magnetron sputtering deposition. The present principles produce uniform stress levels by leveraging pedestal designs using multiple RF bias zones created by multiple RF bias electrodes embedded into an upper surface of a pedestal heater or in a cover of a pedestal. In some embodiments, a pedestal cover in a PVD sputtering deposition tool is divided into several zones which are electrically separated from each other by a gap sizing approximately a few mm. RF bias power from an RF bias power source is applied to each zone through an independent RF bias control system or tuner, whose power is adjustable by tuning a system impedance for each zone. The independent RF bias power zone control provides a need-based RF bias and proactively changes the RF bias power for each zone. As a result, the RF bias zone control effectively flattens a stress profile and reduces the stress range.

Figure 5:
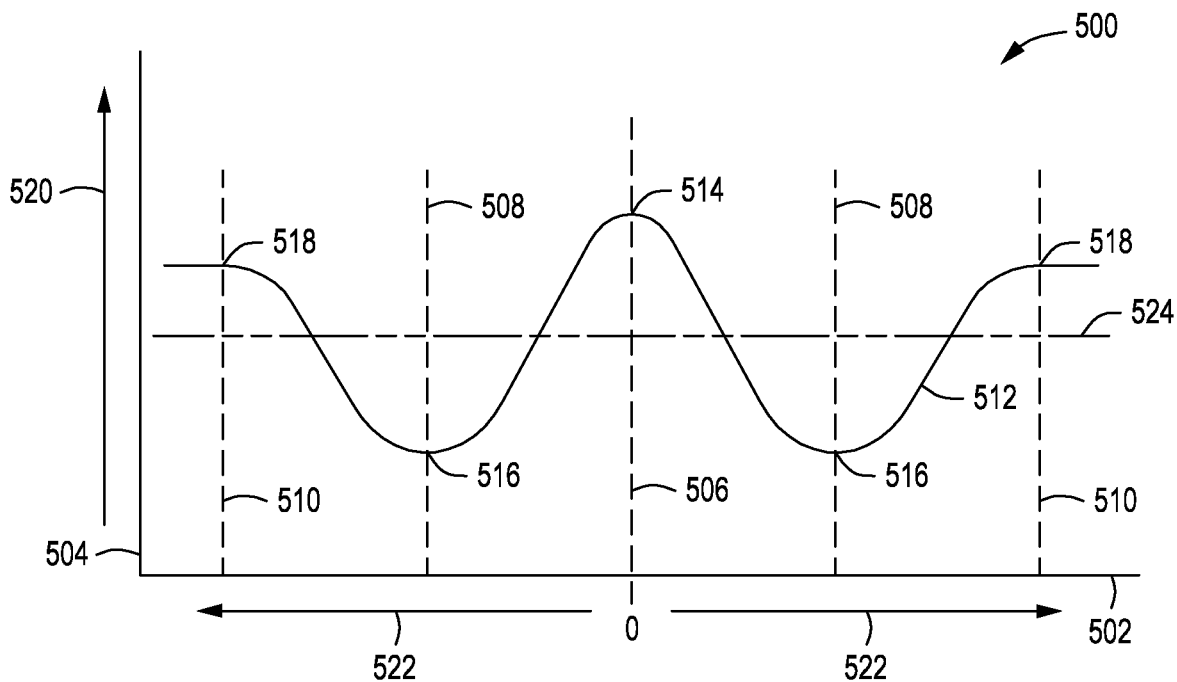
FIG. 5 depicts a graph of wafer stress levels in accordance with some embodiments of the present principles.
Figure 8:
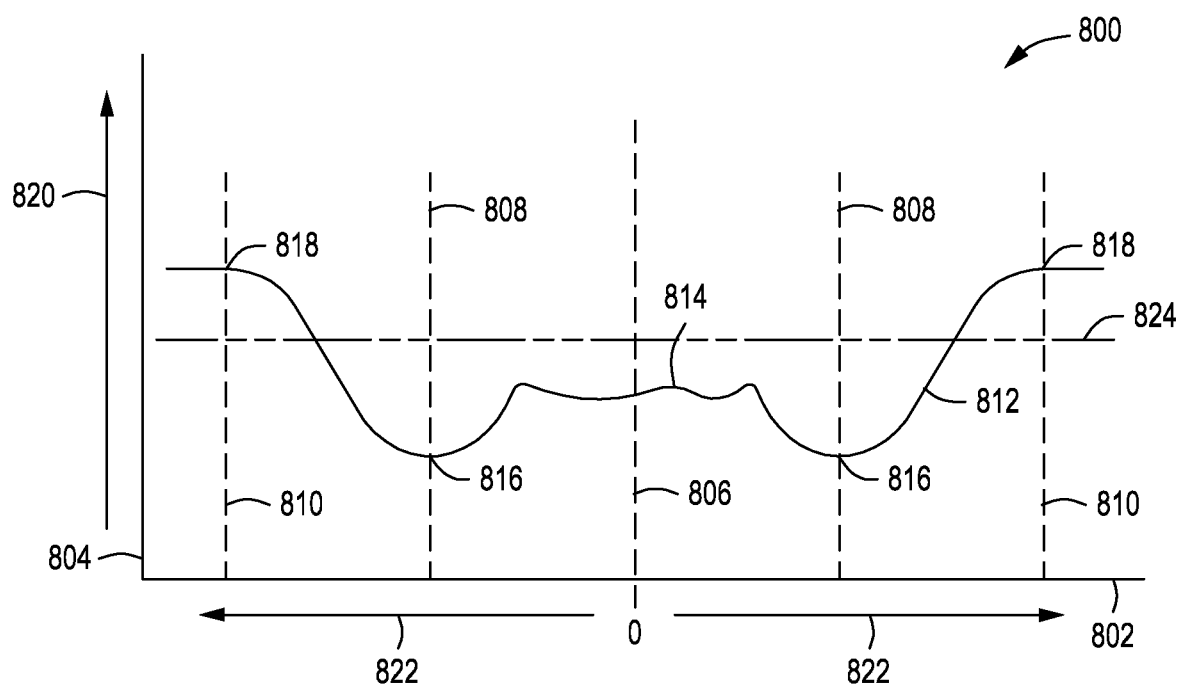
FIG. 8 depicts a graph of wafer stress levels in accordance with some embodiments of the present principles.

In most PVD chambers that use a single electrode for biasing of the substrate, the inventors found that a "W" stress profile 512 is formed such as that shown in a graph 500 of FIG. 5. With a single electrode, the RF bias is adjusted for the entire substrate. Because the plasma energy distribution on the substrate surface is not uniform and the magnetic field strength differs, the result is a stress profile with peaks and valleys like what is shown in the graph 500. The vertical axis 504 denotes stress in MPa which increase in the direction 520. The horizontal axis 502 denotes an increasing radial distance 522 from a center axis 506 of a substrate. In the central area or the zero point of the substrate, a first stress peak 514 is shown. The first stress peak 514 is typically the highest stress level found in the substrate. At the midpoints 508 from the center of the substrate, the lowest levels 516 of stress are found. The stress levels rise again towards the edge 510 of the substrate to second stress peaks 518, forming the "W" profile shape. In some single electrode PVD chambers, the inventors found an edge high stress profile 812 similar to that shown in a graph 800 of FIG. 8. The vertical axis 804 denotes stress in MPa which increase in the direction 820. The horizontal axis 802 denotes an increasing radial distance 822 from a center axis 806 of a substrate. In the central area or the zero point of the substrate, a first stress peak 814 is much lower in stress than the outside edges of the substrate. The first stress peak 814 is generally near the lowest stress level found in the substrate. The lowest levels 816 of stress are found near the midpoints 808. In the high edge stress profile, the stress levels rise substantially at the edge 810 of the substrate to second stress peaks 818, forming the edge high profile shape.

The flattened or uniform line 524 and the uniform line 824 represent a desirable level of stress uniformity (reduced peaks). Ideally, the uniform line 524 and the uniform line 824 would be both uniform and at the lowest overall stress level possible. The inventors sought to solve the technical problem of the non-uniform stress profile by first determining the influencing forces behind the stress and discovering how to make the stress level more uniform. The inventors found that the erratic stress levels were caused by a multitude of factors including non-uniform plasma, rotation of the magnets in the magnetron creating non-uniform magnetic fields, and single source RF biasing for the entire substrate. The inventors discovered that the stress levels were directly influenced by the amount of RF biasing and, that, by implementing RF bias "zones," the erratic stress levels could be shaped, making a more uniform stress profile for the substrate. In short, increasing the RF bias in a zone decreases the amount of stress at that point in the substrate and decreasing the RF bias in a zone increases the amount of stress at that point in the substrate.

If, for example, but not limited to, three zones are used, a center zone could have increased RF bias to bring down the stress level of the first stress peak 514 and an outer zone could have a slightly less increased RF bias to bring down the stress level of the second stress peaks 518, increasing the stress level uniformity in FIG. 5 for the "W" stress profile case. In some cases, if desirable, a midpoint zone could have the RF bias level decreased to allow the stress level to slightly increase to aid in obtaining a uniform stress profile to increase performance of a structure on the substrate. If, for example, three zones are used and applied to the example in FIG. 8, a center zone could have slightly decreased RF bias to bring up the stress level of the first stress peak 814 and an outer zone could have increased RF bias to bring down the stress level of the second stress peaks 818 at the edges of the substrate, increasing the stress level uniformity in FIG. 8 for the edge high stress profile case. If desirable, a midpoint zone could have the RF bias level decreased to allow the stress level to slightly increase to aid in obtaining a more uniform stress profile to increase performance of a structure on the substrate.

One skilled in the art will appreciate that although the examples shown and described use three zones for the sake of brevity and simplicity in explaining the concepts, any number of zones may be utilized for the methods and apparatus described herein. FIG. 1 depicts a cross-sectional view of a PVD chamber 100 in accordance with some embodiments. The PVD chamber 100 represents an example chamber (not intended to be limiting) in which the methods and apparatus of the present principles may be incorporated. The PVD chamber 100 may be used, for example, but not limited to, to deposit aluminum nitride-based materials (for MEMS (microelectromechanical systems) type devices, etc.) and other materials onto a substrate 110 which may contain semiconductor structures. The PVD chamber 100 includes a chamber body 102 and a source 190 that includes a magnetron assembly 104 and a target 112. The substrate 110 rests on a cover 108 on top of a pedestal 192 with or without an electrostatic chuck (ESC) which is supported by a pedestal support 106. One or more gases may be supplied from a gas source 184 into a processing volume 118 of the PVD chamber 100. A pump 182 is connected to the PVD chamber 100 for exhausting the interior of the PVD chamber 100 and to facilitate maintaining a desired pressure inside the PVD chamber 100.

At the top of the processing volume 118 is the target 112 with a backing plate or upper electrode 114. In some embodiments, the target 112 may be aluminum or a conductive metal or a conductive metal compound in which the target 112 may also act as the upper electrode. A DC power source 128 provides DC power to the target 112 via the upper electrode 114 to sputter the target 112 during processing. In some embodiments, a pulsed DC power source 128 may provide pulsing DC power and the like. The upper electrode 114 may comprise a conductive material, such as Mo, Mo—Ti, Ru, Ru—Ti, Pt, Pt—Ti, copper-zinc, copper-chrome, or the same material as the target 112, such that DC power can be coupled to the target 112 via the upper electrode 114. Alternatively, the upper electrode 114 may be non-conductive and may include conductive elements (not shown) such as electrical feedthroughs or the like. The upper electrode 114 may be disc shaped, rectangular, square, or any other shape that may be accommodated by the PVD chamber 100. The upper electrode 114 is configured to support the target 112 such that a front surface of the target 112 opposes the substrate 110 when present. The target 112 may be coupled to the upper electrode 114 in any suitable manner. For example, in some embodiments, the target 112 may be diffusion bonded to the upper electrode 114.

To provide efficient sputtering, a magnetron assembly 104 is disposed above the target 112. The magnetron assembly 104 may be disposed in a magnetron cavity 132 positioned above the target 112. The magnetron assembly 104 includes a plurality of magnets 120, 122 to produce a magnetic field within the chamber body 102. The plurality of magnets 120, 122 may be coupled by a backing plate 134. Each magnet 120 may be arranged so one pole is facing the target 112, and each magnets 122 may be arranged so the other pole is facing the target 112. For example, as shown in FIG. 1, each magnet 120 is arranged so the south pole is facing the target 112, and each magnet 122 is arranged so the north pole is facing the target 112. The magnets 120 and magnets 122 may be alternately arranged along a longitudinal dimension (in the X-axis direction) of the magnetron assembly 104, as shown in FIG. 1. In some embodiments, a pair of adjacent magnets 120, 122 may be replaced with a single U-shaped magnet, and the magnetron assembly 104 includes a plurality of U-shaped magnets. In one embodiment, the magnetron assembly 104 is rotated about the central axis 154, so the central axis 154 is also the axis of rotation of the magnetron assembly 104. The magnetron assembly 104 is coupled to a shaft 138 driven by a motor 174. The motor 174 may be also capable of moving the magnetron assembly 104 along the Z-axis. In one embodiment, as shown in FIG. 1, the magnetron assembly 104 is positioned so the central axis 154 is the axis of symmetry of the longitudinal dimension of the magnetron assembly 104.

An RF bias power source 126 may be coupled to a first electrode 160, a second electrode 162, and a third electrode 164 in order to induce zoned bias control on the substrate 110. The first electrode 160, the second electrode 162, and the third electrode 164 are fed RF bias power through a stress profile tuner 166 that controls the amount of bias power fed to each individual zone by RF bias power coming from the RF bias power source 126 via a match network 168 such as, for example, an automatic match that automatically compensates for the impedance load to maximize power transfer of the RF bias power source 126. For example, RF energy supplied by the RF bias power source 126 may range in frequency from about 2 MHz to about 60 MHz, for example, non-limiting frequencies such as 2 MHz, 13.56 MHz, or 60 MHz can be used. In some embodiments, the RF power may be supplied by the RF bias power source 126 in a range from approximately a few tens of watts to a few hundreds of watts. In some embodiments, the RF power supplied by the RF bias power source 126 may be approximately a few kilowatts up to 10 kW. In some embodiments, the DC or pulsed DC power source 128 may provide DC or pulsed DC power in range from approximately 1 kW to approximately 20 kW. In some embodiments, the DC or pulsed DC power source 128 may provide DC or pulsed DC power in range from approximately 20 kW to approximately 60 kW. In other applications, the pedestal 192 may be grounded or left electrically floating.

The PVD chamber 100 further includes a process kit shield or shield 152 to surround the processing volume 118 of the PVD chamber 100 and to protect other chamber components from damage and/or contamination from processing. In some embodiments, the shield 152 may be grounded at an uppermost point 196 to the chamber body to provide an RF ground return path. The shield 152 extends downwardly and may include a generally tubular portion having a generally constant diameter that generally surrounds the processing volume 118. The shield 152 extends along the walls of the chamber body 102 downwardly to an uppermost surface 198 of the cover 108.

A controller 144 may be provided and coupled to various components of the PVD chamber 100 to control the operation thereof. The controller 144 includes a central processing unit (CPU) 146, a memory 148, and support circuits 150. The controller 144 may control the PVD chamber 100 directly, or via computers (or controllers) associated with a particular process chamber and/or support system components. The controller 144 may be one of any form of general-purpose computer processor that can be used in an industrial setting for controlling various chambers and sub-processors. The memory, or computer readable medium, 148 of the controller 144 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 150 are coupled to the CPU 146 for supporting the processor in a conventional manner. These circuits include cache, power supplies, clock circuits, input/output circuitry and subsystems, and the like. Methods to control the PVD chamber 100 and/or processes may be stored in the memory 148 as software routine that may be executed or invoked to control the operation of the PVD chamber 100 in the manner described herein. The software routine may also be stored and/or executed by a second CPU (not shown) that is remotely located from the hardware being controlled by the CPU 146. For example, in some embodiments, recipes and/or stress profiles may be stored in the controller 144, and the controller 144 may interface with the stress profile tuner 166 to facilitate in controlling the zoned RF bias applied to the substrate 110.

Figure 2:
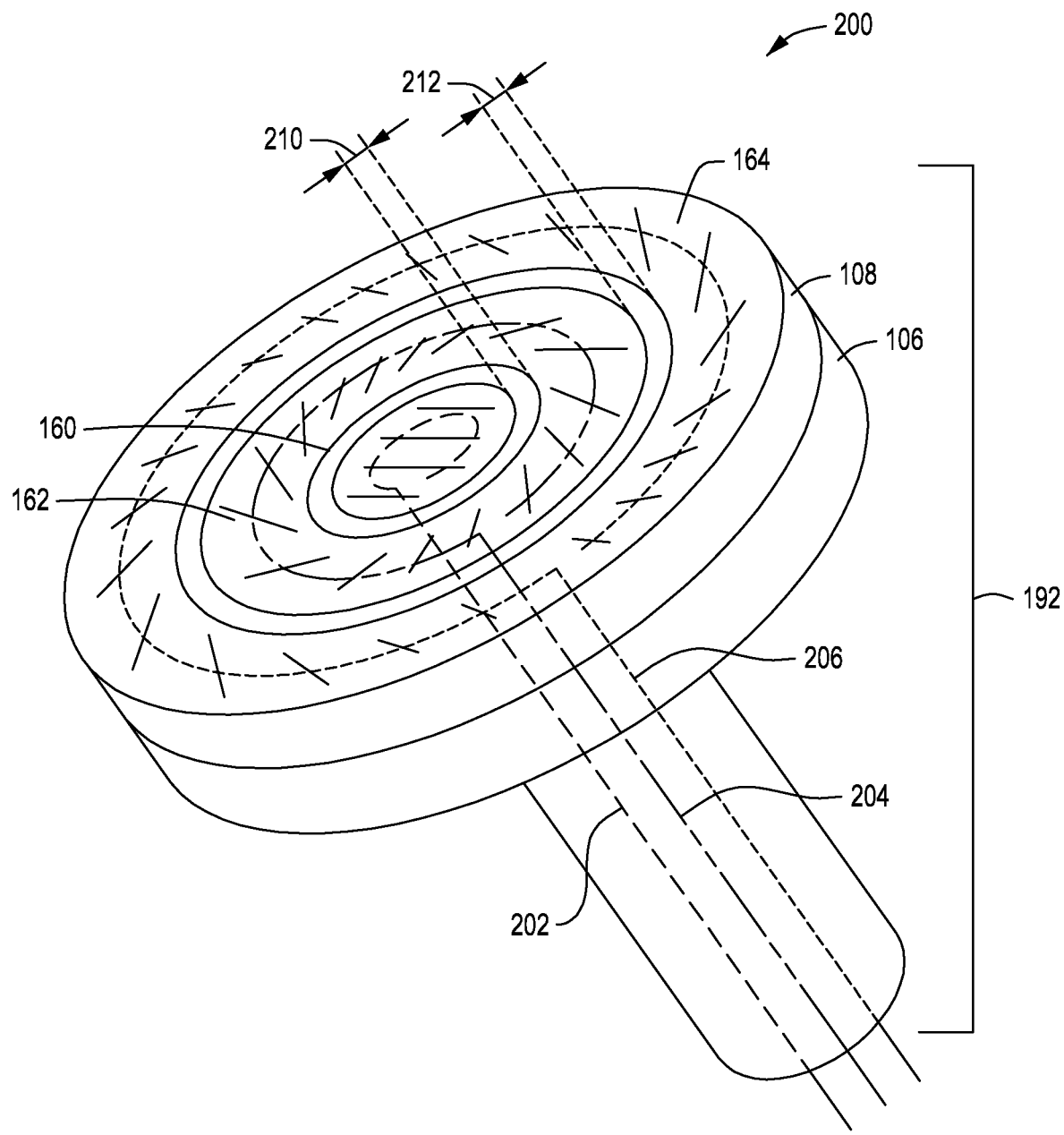
FIG. 2 depicts an isometric view of a pedestal with multiple RF bias zones in accordance with some embodiments of the present principles.

FIG. 2 depicts an isometric view 200 of the pedestal 192 with multiple RF bias zones in accordance with some embodiments. The pedestal 192 includes the cover 108 that is configured to support the substrate 110 and to house the first electrode 160, the second electrode 162, and the third electrode 164. In some embodiments (not shown), the first electrode 160, the second electrode 162, and the third electrode 164 may be included in a pedestal heater assembly atop the pedestal support 106. The first electrode 160, the second electrode 162, and the third electrode 164 are electrically connected to the stress profile tuner 166 via electrical connections 202, 204, 206 respectively. In some embodiments, the spacing between the first electrode and the second electrode 210 is approximately a few mm. In some embodiments, the spacing 212 between the second electrode and the third electrode is approximately a few mm. In some embodiments, the spacing 212 is an air gap or filled with an electrically insulating material. The spacing is selected such that the spacing is great enough to ensure that electrical isolation is maintained between the first electrode, the second electrode, and the third electrode but not too far apart such that biasing "dead zones" or reduced biasing zones occur between the electrodes.

Figure 3:
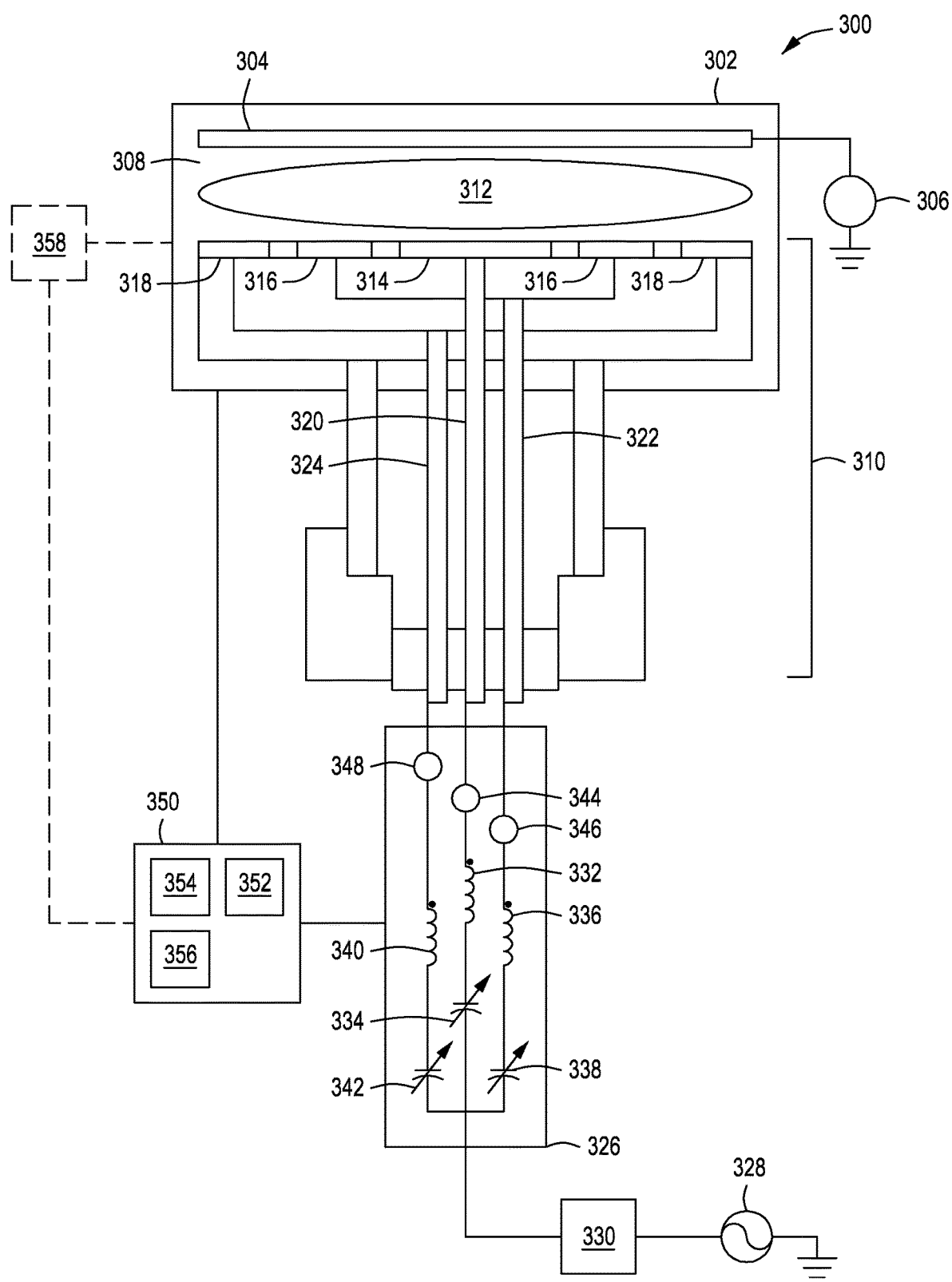
FIG. 3 depicts a cross-sectional view of a PVD chamber with multiple RF bias zones in a pedestal in accordance with some embodiments of the present principles.

FIG. 3 depicts a cross-sectional view 300 of a PVD chamber 302 with multiple RF bias zones in a pedestal in accordance with some embodiments. The PVD chamber 302 includes an upper electrode 304 connected to a DC power source 306 for generating plasma 312, a processing volume 308, and a pedestal 310. The pedestal 310 includes a first electrode 314, a second electrode 316, and a third electrode 318. The first electrode 314, the second electrode 316, and the third electrode 318 are electrically connected to a first RF rod 320, a second RF rod 322, and a third RF rod 324, respectively. The first RF rod 320, the second RF rod 322, and the third RF rod 324 are electrically connected to a stress profile tuner 326 which is electrically connected to an RF bias power source 328 via a match network 330 such as, for example, an automatic match. In some embodiments, the stress profile tuner 326 includes a first tuning circuit that includes a first inductor 332 and a first tunable capacitor 334 that are electrically in series with the first RF rod 320 and the match network 330. The stress profile tuner 326 also includes a second tuning circuit that includes a second inductor 336 and a second tunable capacitor 338 that are electrically in series with the second RF rod 322 and the match network 330. The stress profile tuner 326 also includes a third tuning circuit that includes a third inductor 340 and a third tunable capacitor 342 that are electrically in series with the third RF rod 324 and the match network 330. The stress profile tuner 326 independently adjusts the resonance of each of the electrodes by adjusting the capacitance to alter the amount of bias power applied to each electrode. In general, the more resonant at a given frequency, the more RF bias power provided. To determine how much to adjust the resonance with the tunable capacitors, the RF voltage of each electrode is determined using voltage/current (VI) sensors. A first VI sensor 344 is electrically connected between the first RF rod 320 and the first inductor 332, a second VI sensor 346 is electrically connected between the second RF rod 322 and the second inductor 336, and a third VI sensor 348 is electrically connected between the third RF rod 324 and the third inductor 340. In some embodiments, the stress profile tuner 326 may only have the first tunable capacitor 334 for adjusting the first electrode 314, the second tunable capacitor 338 for adjusting the second electrode 316 and the third tunable capacitor 342 for adjusting the third electrode 318 without the first inductor 332, the second inductor 336, and the third inductor 340.

The stress profile tuner 326 uses the RF voltage level of each electrode to individually adjust the RF bias applied to the electrode to make a more uniform stress profile. The individual adjustments of the RF bias on each electrode may be manually or automatically adjusted based on prior stress profiles, recipe requirements, or film deposition requirements and the like. For example, in some embodiments, a servomechanism may be used that accepts an electrical signal from a controller (e.g., stress controller 350, controller 144, etc.) and then mechanically adjusts a variable capacitor that is electrically in series with an electrode to alter the impedance of the electrode. Adjustments may also be made based upon the chamber parameters and the like (magnetron used, target to wafer distances, power range, power type, etc.). In some embodiments, a stress controller 350 may be used. The stress controller 350 may be a dedicated controller for stress profile changes that includes a CPU 352, memory 354, and support circuits 356. In some embodiments, the stress controller 350 may also reside within a system controller such as controller 144 depicted in FIG. 1. In some embodiments, the stress controller 350 may be embedded within the stress profile tuner 326. In some embodiments, the stress controller 350 may accept user inputs and/or system inputs regarding a stress profile such as from a recipe process, test data, and the like. In some embodiments, the stress controller 350 may also receive stress profiles and/or information regarding stress from a stress detector 358. The stress detector 358 may be ex-situ to the PVD chamber 302. In other words, a sample substrate may be sent out for analysis and the information may then be fed back into the stress controller 350 determination of RF bias changes of the electrodes based. The stress controller 350 may also compare the received information with historical data before making adjustment decisions. In some embodiments, the stress detector 358 may be in-situ with the PVD chamber. As such, the stress profile and/or information may be obtained more or less in real-time and fed back to the stress controller 350 for evaluation and determination of changes in RF bias to yield a much quicker stress profile change in subsequently processed substrates in the PVD chamber.

Figure 4:
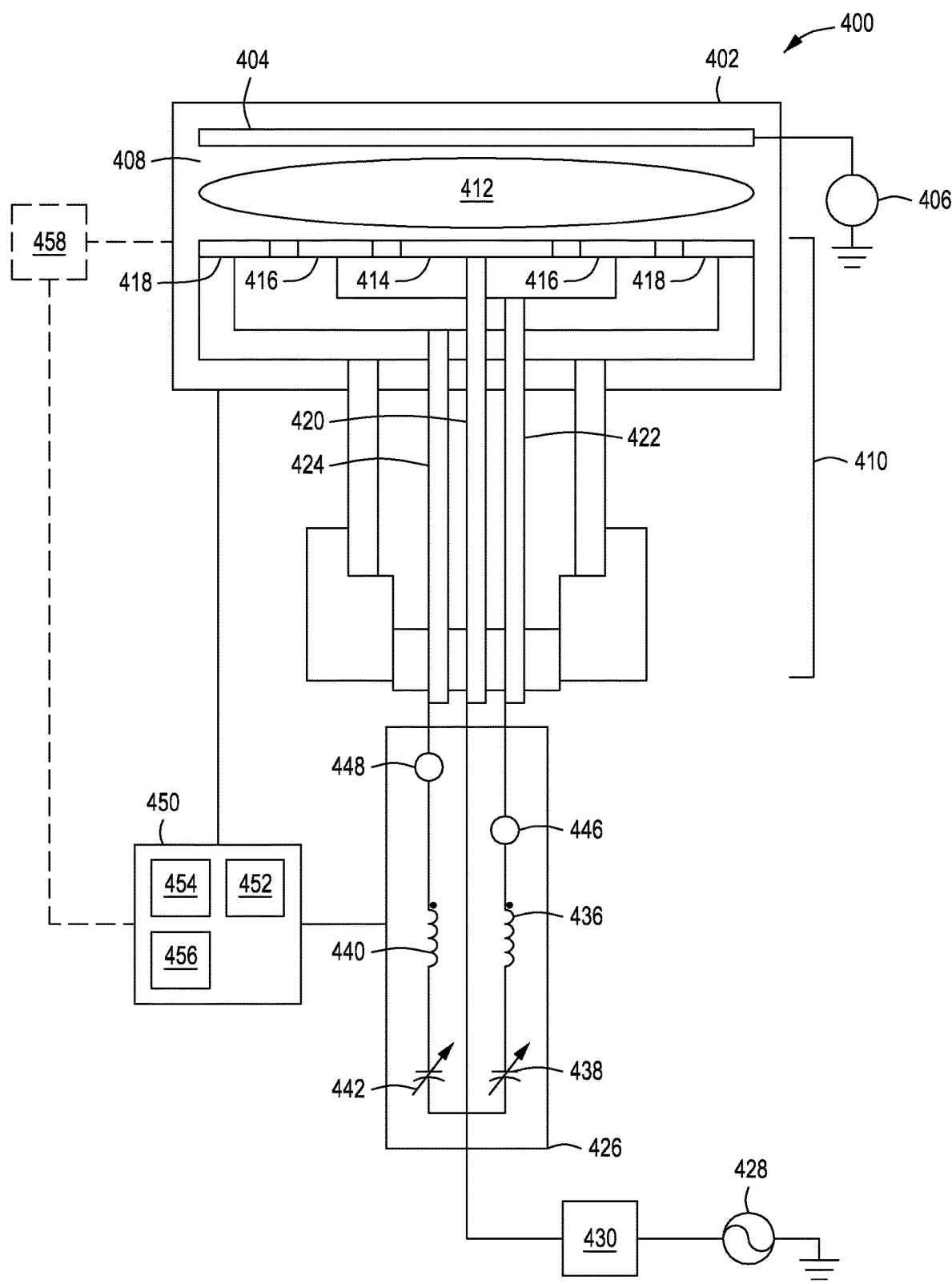
FIG. 4 depicts a cross-sectional view of a PVD chamber with the middle and outer RF bias zones individually tunable in accordance with some embodiments of the present principles.

FIG. 4 depicts a cross-sectional view 400 of the PVD chamber 402 with the middle and outer RF bias zones individually tunable in accordance with some embodiments. The PVD chamber 402 includes an upper electrode 404 connected to a DC power source 406 for generating plasma 412, a processing volume 408, and a pedestal 410. The pedestal 410 includes a first electrode 414, a second electrode 416, and a third electrode 418. The first electrode 414, the second electrode 416, and the third electrode 418 are electrically connected to a first RF rod 420, a second RF rod 422, and a third RF rod 424, respectively. The first RF rod 420, the second RF rod 422, and the third RF rod 424 are electrically connected to a stress profile tuner 426 which is electrically connected to an RF bias power source 428 via a match network 430 such as, for example, an automatic match. In some embodiments, the stress profile tuner 426 includes a first tuning circuit that includes a first inductor 436 and a first tunable capacitor 438 that are electrically in series with the second RF rod 422 and the match network 430. The stress profile tuner 426 also includes a second tuning circuit including a second inductor 440 and a second tunable capacitor 442 that are electrically in series with the third RF rod 424 and the match network 430. The stress profile tuner 426 independently adjusts the resonance of each of the second electrode 416 and the third electrode 418 relative to the amount of RF bias power in the first electrode 414 by adjusting the capacitance to alter the amount of bias power applied to each of the second electrode 416 and the third electrode 418. In general, the more resonant at a given frequency, the more RF bias power provided. To determine how much to adjust the resonance with the tunable capacitors, the RF voltage of each of the second electrode 416 and the third electrode 418 is determined using voltage/current (VI) sensors. A first VI sensor 446 is electrically connected between the second RF rod 422 and the first inductor 436 and a second VI sensor 448 is electrically connected between the third RF rod 424 and the second inductor 440. In some embodiments, the stress profile tuner 426 may only have the first tunable capacitor 438 for adjusting the second electrode 416 and the second tunable capacitor 442 for adjusting the third electrode 418 without the first inductor 436 and without the second inductor 440.

The stress profile tuner 426 uses the RF voltage level of each of the second electrode 416 and the third electrode 418 to individually adjust the RF bias applied to the second electrode 416 and the third electrode 418 to make a more uniform stress profile relative to the first electrode 414 (the non-capacitance tunable RF bias electrode). The individual adjustments of the RF bias on each of the second electrode 416 and the third electrode 418 may be manually or automatically adjusted based on prior stress profiles, recipe requirements, or film deposition requirements and the like. For example, in some embodiments, a servomechanism may be used that accepts an electrical signal from a controller (e.g., stress controller 450, controller 144, etc.) and then mechanically adjusts a variable capacitor that is electrically in series with an electrode to alter the impedance of the electrode. Adjustments may also be made based upon the chamber parameters and the like (magnetron used, target to wafer distances, power range, power type, etc.). In some embodiments, a stress controller 450 may be used. The stress controller 450 may be a dedicated controller for stress profile changes that includes a CPU 452, memory 454, and support circuits 456 as described above for the controller 144 of FIG. 1. In some embodiments, the stress controller 450 may also reside within a system controller such as the controller 144. In some embodiments, the stress controller 450 may be embedded within the stress profile tuner 426. In some embodiments, the stress controller 450 may accept user inputs and/or system inputs regarding a stress profile such as from a recipe process, test data, and the like. In some embodiments, the stress controller 450 may also receive stress profiles and/or information regarding stress from a stress detector 458. The stress detector 458 may be ex-situ to the PVD chamber 402. In other words, a sample substrate may be sent out for analysis and the information may then be fed back into the stress controller 450 determination of RF bias changes of the electrodes based. The stress controller 450 may also compare the received information with historical data before making adjustment decisions. In some embodiments, the stress detector 458 may be in-situ with the PVD chamber. As such, the stress profile and/or information may be obtained more or less in real-time and fed back to the stress controller 450 for evaluation and determination of changes in RF bias to yield a much quicker stress profile change in subsequently processed substrates in the PVD chamber.

Figure 7:
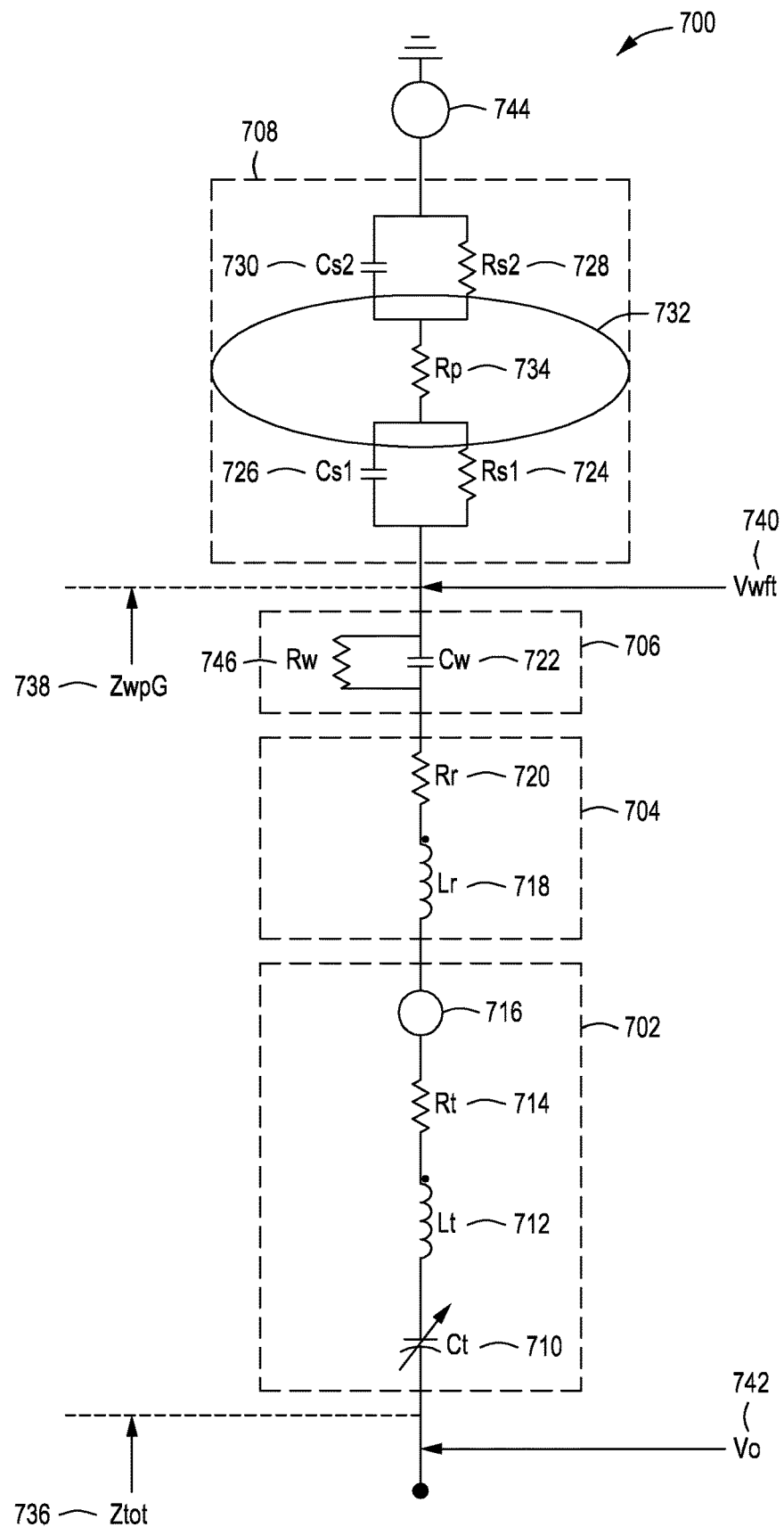
FIG. 7 depicts an equivalent circuit for a PVD chamber in accordance with some embodiments of the present principles.

To better understand the operation of a stress profile tuner 702, an equivalent circuit 700 of a PVD chamber is depicted in FIG. 7. For the sake of brevity, the equivalent circuit depicts the stress profile tuner 702 tuning a single electrode via a single RF rod 704. The stress profile tuner 702 includes a tunable capacitance (Ct) 710, an inductance (Lt) 712, and resistance (Rt) 714. The RF rod 704 has an inductance (Lr) 718 and a resistance (Rr) 720. The wafer 706 has a capacitance (Cw) 722 and a resistance (Rw) 746. The processing volume 708 of the PVD chamber has plasma 732 with a resistance (Rp) 734. The plasma 732 has an upper plasma sheath with a capacitance (Cs2) 730 and a resistance (Rs2) 728 in parallel. The plasma 732 has a lower plasma sheath with a capacitance (Cs1) 726 and a resistance (Rs1) 724 in parallel.

The stress profile tuner 702 modulates the RF path impedance to each of the electrodes resulting in different RF voltages to each of the different electrodes. For example, as the tunable capacitance (Ct) 710 is changed, the total impedance Ztot 736 (total input impedance) is changed, while the impedance ZwpG 738 (wafer's top to plasma to ground) remains relatively unchanged (the plasma 732 is primarily driven and determined by the DC power 744 applied to the upper electrode in the PVD chamber). Through voltage divider, the Vwft 740 (voltage at wafer top) divided by V0 742 (input voltage) is equal to the impedance ZwpG 738 divided by the total impedance Ztot 736. Therefore, the Vwft 740 applied directly to the deposited film is changed accordingly. A series resonance is reached when the capacitive impedance along RF path from the location indicated by the input voltage V0 742 through the stress profile tuner 702 and RF rod 704 to the top of wafer 706, is equal to the magnitude of inductive impedance along the same path, such that these two impedances are cancelled out, which results in the lowest impedance along the path. Since the total impedance Ztot is tuned to the lowest, the maximum RF voltage on Vwft 740 is achieved by voltage divider of ZwpG 738 over Ztot 736 (the denominator). A VI sensor 716 can be used to measure a voltage at the base of the RF electrode which can be used to extrapolate the Vwft 740 without requiring VI sensors to be embedded in the pedestal, reducing complexity of the pedestal and reducing costs. The VI sensor 716 allows for closed-loop control of the film stress profile by allowing the stress profile tuner 702 to maintain a higher voltage on a zone where stress is peaked and maintain a lower voltage on a zone where stress is dipped. RF voltage applied on top of a substrate or wafer will directly drive ion bombardment into a deposited film, densifying the film and changing the film's stress. Higher RF voltage values tend to drive the film stress compressively (decrease or make negative). Lower RF voltage values tend to make the film stress tensile (increase or make positive). The film stress on the wafer can therefore be locally modulated in an area or zone associated with each electrode. Better film stress uniformity can be achieved when the stress profile is separately modulated and compensated in each zone.

Figure 6:
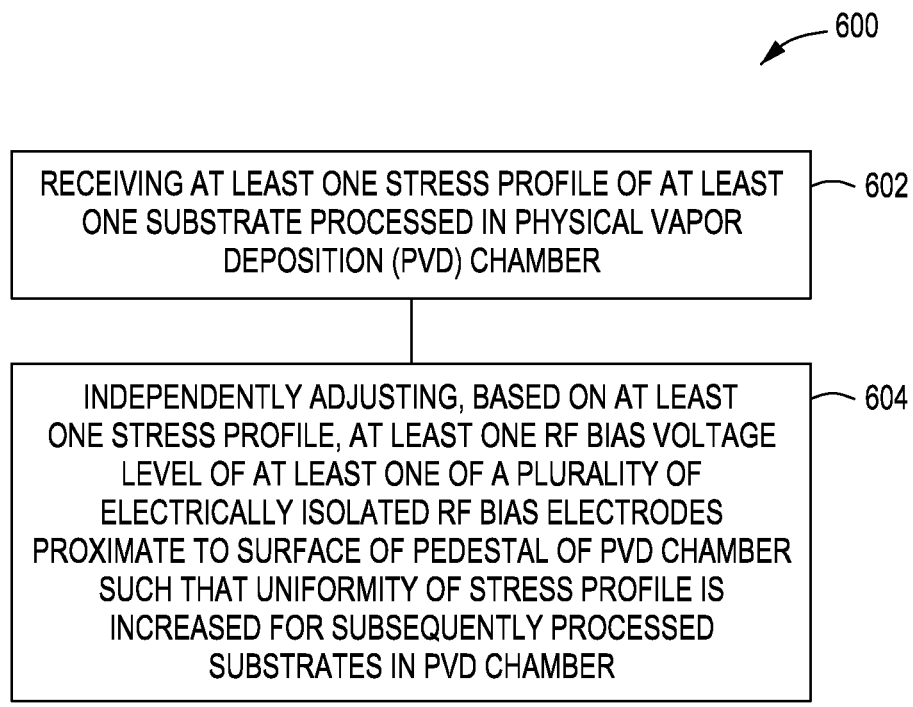
FIG. 6 is a method of biasing a wafer to normalize stress levels in accordance with some embodiments of the present principles.

FIG. 6 is a method 600 of biasing a wafer to normalize stress levels in accordance with some embodiments. In block 602, at least one stress profile of at least one substrate processed in a physical vapor deposition (PVD) chamber is received. The stress profile may come from a test measurement set that is ex-situ from the PVD chamber or in-situ in the PVD chamber. The test measurement set may include X-ray fluorescence spectroscopy (XRF) processes and the like. The advantage of using in-situ XRF testing is near real-time feedback between adjustments of the RF bias in individual electrodes and the stress profile achieved in the a given substrate. The stress profile information may be used to manually or automatically adjust the individual electrodes. In block 604, based on the at least one stress profile, at least one RF bias voltage level of at least one of a plurality of electrically isolated RF bias electrodes proximate to a surface of a pedestal of the PVD chamber are independently adjusted such that a uniformity of a stress profile is increased for subsequently processed substrates in the PVD chamber. In some embodiments, the method 600 may further include independently adjusting the at least one RF bias voltage level by changing a value of a tunable capacitor that is positioned in series between the at least one of the plurality of electrically isolated RF bias electrodes and an RF bias power source. In some embodiments, the method 600 may include independently adjusting one or more of the at least one RF bias voltage levels of one or more of the at least one of the plurality of electrically isolated RF bias electrodes relative to a non-adjustable one of the plurality of electrically isolated RF bias electrodes to normalize the stress profile. In some embodiments, VI sensors may be used for each individual electrode to determine the RF voltage level on each of the electrodes.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus for adjusting film properties during deposition, comprising:
   a physical vapor deposition (PVD) chamber with a processing volume;
   an upper electrode positioned in the PVD chamber above the processing volume and connected to a direct current (DC) power source, the DC power source configured to generate plasma within the processing volume;
   a pedestal configured to support a substrate during processing in the PVD chamber and positioned below the processing volume, wherein the upper electrode is positioned parallel to an uppermost surface of the pedestal that supports the substrate;
   a cover configured to support a substrate is positioned on an uppermost surface of the pedestal, wherein the cover includes a plurality of electrodes with circular shapes in the cover and arranged in expanding concentric circles about a center axis of the cover;
   a substrate stress profile tuner electrically connected to each of the plurality of electrodes and configured to independently adjust an RF voltage level of at least one of the plurality of electrodes relative to RF ground;
   an RF bias source electrically connected to the substrate stress profile tuner via a match network; and
   a controller in communication with the substrate stress profile tuner and configured to automatically and independently adjust stress levels based on at least one stress profile at a plurality of annular or circular areas across a film as the film is deposited on the substrate.

2. The apparatus of claim 1, wherein the DC power source is a pulsed DC power source.

3. The apparatus of claim 1, wherein the PVD chamber includes a magnetron assembly configured with at least one rotating permanent magnet positioned above the upper electrode.

4. The apparatus of claim 1, wherein the pedestal is formed of a ceramic material and contains electrical connections between the plurality of electrodes and the substrate stress profile tuner.

5. The apparatus of claim 1, wherein the plurality of electrodes includes a first electrode, a second electrode, and a third electrode, and wherein the second electrode is positioned between and electrically separated from the first electrode and the second electrode and the substrate stress profile tuner is configured to independently adjust the RF voltage level of at least the second electrode and the third electrode relative to RF ground.

6. The apparatus of claim 5, further comprising:
a first RF rod in the pedestal electrically connecting the first electrode to the substrate stress profile tuner;
a second RF rod in the pedestal electrically connecting the second electrode to the substrate stress profile tuner; and
a third RF rod in the pedestal electrically connecting the third electrode to the substrate stress profile tuner.

7. The apparatus of claim 5, wherein the substrate stress profile tuner is configured to independently adjust an RF bias voltage level of the first electrode, the second electrode, and the third electrode relative to RF ground.

8. The apparatus of claim 5, wherein the substrate stress profile tuner includes:
a first tuning circuit positioned inside the substrate stress profile tuner and includes at least one first adjustable capacitor, wherein the first tuning circuit is electrically connected between the match network and the second electrode; and
a second tuning circuit positioned inside the substrate stress profile tuner which includes at least one second adjustable capacitor, wherein the second tuning circuit is electrically connected between the match network and the third electrode.

9. The apparatus of claim 8, further comprising:
a first voltage sensor electrically positioned between the first adjustable capacitor and the second electrode; and
a second voltage sensor electrically positioned between the second adjustable capacitor and the third electrode.

10. The apparatus of claim 8, wherein the substrate stress profile tuner further includes:
a third tuning circuit positioned inside the substrate stress profile tuner which includes at least one third adjustable capacitor, wherein the third tuning circuit is electrically connected between the match network and the first electrode.

11. The apparatus of claim 10, further comprising:
a third voltage sensor electrically positioned between the third adjustable capacitor and the first electrode.

12. The apparatus of claim 5, wherein the first electrode has a disk shape, the second electrode has a first annular shape larger than the disk shape, and the third electrode has a third annular shape larger than the first annular shape.

13. The apparatus of claim 1, further comprising:
a stress detector that is configured to determine at least one stress profile of at least one substrate, wherein the stress detector is in communication with the controller.

14. The apparatus of claim 13, wherein the stress detector is located in-situ in the PVD chamber or ex-situ from the PVD chamber.

15. An apparatus for adjusting film properties during deposition, comprising:
a pedestal configured to support a substrate during processing in a PVD chamber and configured to be positioned below a processing volume of the PVD chamber wherein the pedestal has an uppermost surface that supports the substrate and is configured to be positioned with the uppermost surface parallel to an upper electrode of a plasma vapor deposition (PVD) process chamber when installed in the PVD process chamber;
a first electrode with a disk shape that is positioned in a central area of the pedestal proximate the uppermost surface of the pedestal, wherein the first electrode is configured to accept a first RF bias voltage adjustment from a substrate stress profile tuner;
a second electrode with a first annular shape that surrounds the first electrode proximate an uppermost surface of the pedestal and is electrically isolated from the first electrode, wherein the second electrode is configured to accept a second RF bias voltage adjustment from the substrate stress profile tuner;
a third electrode with a second annular shape that surrounds the second electrode proximate an uppermost surface of the pedestal and is electrically isolated from the second electrode, wherein the third electrode is configured to accept a third RF bias voltage adjustment from the substrate stress profile tuner; and
a controller in communication with the substrate stress profile tuner and configured to automatically and independently adjust stress levels based on at least one stress profile at a plurality of annular or circular areas across a film as the film is deposited on the substrate.

16. The apparatus of claim 15, wherein the first electrode, the second electrode, and the third electrode are electrically separated by an air gap or an electrically insulating material.

17. The apparatus of claim 15, further comprising:
a first RF rod in the pedestal which is configured to electrically connect the first electrode to the substrate stress profile tuner;
a second RF rod in the pedestal which is configured to electrically connect the second electrode to the substrate stress profile tuner; and
a third RF rod in the pedestal which is configured to electrically connect the third electrode to the substrate stress profile tuner.

18. The apparatus of claim 15, further including:
the substrate stress profile tuner electrically connected to the first electrode, the second electrode, and the third electrode and configured to independently adjust an RF voltage level of at least the second electrode and the third electrode relative to RF ground, and
wherein the substrate stress profile tuner includes:
a first tuning circuit positioned inside the substrate stress profile tuner which includes at least one first adjustable capacitor, wherein the first tuning circuit is configured to be electrically connected to the second electrode; and
a second tuning circuit positioned inside the substrate stress profile tuner which includes at least one second adjustable capacitor, wherein the second tuning circuit is configured to be electrically connected to the third electrode.

* * * * *